United States Patent [19]

Moutou et al.

[11] 4,134,122

[45] Jan. 9, 1979

[54] HYPERFREQUENCY DEVICE WITH GUNN EFFECT

[75] Inventors: Paul C. Moutou; Jean-Jacques Godart, both of Paris, France

[73] Assignee: Thomson-CSF, Paris, France

[21] Appl. No.: 872,554

[22] Filed: Jan. 26, 1978

Related U.S. Application Data

[63] Continuation of Ser. No. 763,698, Jan. 28, 1977, abandoned, which is a continuation of Ser. No. 635,772, Nov. 26, 1975, abandoned.

[30] Foreign Application Priority Data

Nov. 29, 1974 [FR] France .............................. 74 39192

[51] Int. Cl.² .......................................... H01L 47/02
[52] U.S. Cl. ........................................ 357/3; 357/15; 357/22; 357/36; 357/68; 357/71
[58] Field of Search .................... 357/3, 15, 22, 36, 68, 357/71; 331/107 G

[56] References Cited

U.S. PATENT DOCUMENTS

| | | | |
|---|---|---|---|
| 3,252,003 | 5/1966 | Schmidt | 357/22 |
| 3,541,404 | 11/1970 | Hilsum | 357/3 |
| 3,600,705 | 8/1971 | Tantraporn et al. | 357/3 |
| 3,609,473 | 9/1971 | Bittmann | 357/36 |
| 3,667,010 | 5/1972 | Rindner et al. | 357/3 |
| 3,991,328 | 11/1976 | Upadhyayula | 357/3 |

FOREIGN PATENT DOCUMENTS

1266154  3/1972  United Kingdom .................. 357/3

*Primary Examiner*—William D. Larkins
*Attorney, Agent, or Firm*—Cushman, Darby & Cushman

[57] ABSTRACT

In a Gunn effect device the cathode contact is formed by an assembly of zones through which is effected the injection of current adjoining an assembly of zones which on the contrary are capable of blocking this injection. A layer of dielectric material possibly insulates these two types of zones. A metallic control electrode assures the arrival of the current. The respective dimensions of these zones are determined in such manner that, in operation, the injected current is channeled between parts of the device made dielectric by the creation of space charges.

8 Claims, 3 Drawing Figures

HYPERFREQUENCY DEVICE WITH GUNN EFFECT

This is a continuation, of application Ser. No. 763,698 filed Jan. 28, 1977, which was a continuation of Ser. No. 635,772, filed Nov. 26, 1975, both abandoned.

The present invention relates to a structure of a hyperfrequency device having a Gunn effect, particularly developed for controlling the instability phenomena by preventing the formation of domains, the device then being able to function in accordance with the procedure known as limited space charge accumulation (L.S.A.).

It is more particularly concerned with the Gunn effect devices which comprise an active zone of small thickness applied by epitaxy to a very heavily doped substrate. A first parameter has to be considered: the value of the product (n.l) of the number n of charge carriers per $cm^3$ by the length of the element, being measured along the direction of the propagation of the current. In effect, it is generally accepted that if (n.l) is equal or greater than $10.^{12}$ $cm^{-2}$, a domain of high electric field to be formed in the element. However, it is also necessary to take a second parameter into account, namely, the thickness d of the active zone, considered in the plane perpendicular to the direction of current propagation. In actual fact, there is only a danger of domains appearing if the product(n.d) exceeds a certain value which is generally accepted as being of the order of $10^{11}$ $cm^{-2}$. Consequently, for a product (n.l) leading in principle to the formation of domains, it is possible to avoid these instability phenomena by acting on the product (n.d), that is to say, on the dimension d as defined above for a given doping rate.

The present invention has specifically for its object a new structure of a Gunn effect device which is capable of functioning by the "domaine-free" procedure, whatever may be the value of the product (n.l).

It has more particularly for its object a structure of which the essential characteristic is to permit a channelling of the propagation of the current defined by dielectric zones established actually within the device. For this purpose, the device is provided with a cathode contact comprising a mosaic of conducting zones adjoining zones which are capable of blocking the current: these two types of zones being of such dimensions that the space charges created at the level of the blocking zones and constituting the said dielectric zones have the depth at least equal to the thickness of the active layer. The said space charges thus reach at least the substrate on which the active layer is applied by epitaxy. Thus, the current is propagated to the interior of filiform or lamellar channels, the thickness d of which is controlled and produces a product (nd), such that the domains are avoided.

The invention will be best understood by means of the explanations which are to follow and the accompanying figures, in which.

Figure 1:
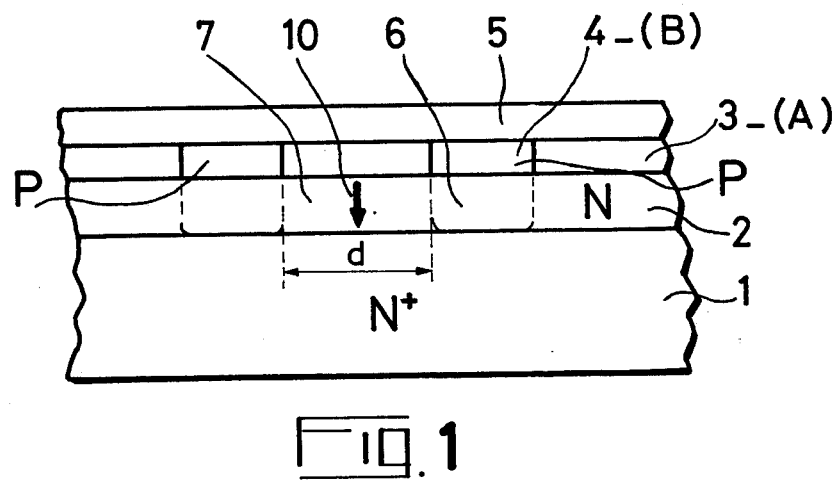
FIG. 1 represents a sectional view of a device according to the invention.

As shown in FIG. 1, a device according to the invention comprises essentially a very conductive substrate 1, which is made of a semiconductor material of the $N^+$ type, for example, of GaAs. A layer 2 of the same semiconductor material of N type is deposited by epitaxy on this substrate 1. This is a layer of relatively small thickness, doped to about $10^{15} cm^{-3}$.

According to one important feature of the invention, a cathode contact is formed on this layer 2, which in fact constitutes the active layer of the device in which the Gunn effect is produced. According to the invention, this cathode contact is composed of a mosaic of conducting zones and zones which are capable of blocking the current. The conducting zones are, for example, formed by metallic areas 3 and the zones blocking the current are formed by semiconductor zones 4 which provide a potential barrier.

In the example which is shown simply by way of illustration in the figure, these zones 4 are zones of type P established at the surface of the active layer of type N and forming with it a junction of the PN type. Actually, it could also be a Schottky barrier, and in this case, these zones 4 would be formed by a metal capable of forming such a barrier with the subjacent semiconductor. On the entire element as thus formed, a metallic deposit 5 serves as cathode control and current supply electrode. According to one important feature of the invention, the dimensions and the distribution of these zones at the surface of the active layer 2 opposite to the substrate 1 serving the purpose of anode contact are calculated for permitting the establishment of space charges 6 at the level of the blocking zones 4, these charges being defined on the figure by the broken lines, the said space charges according to the invention penetrating into the active layer 2 until they at least reach the substrate 1 or even penetrate beyond the latter.

Under these conditions, and as shown by the figure under consideration, the injection of current produced by means of the cathode control electrode 5 is effected as indicated by the arrow 10, at the level of the conducting zones 3. The current then follows a channel defined by the dielectric parts, in which are produced the space charges, the breadth of which is controlled and is equal to the previously defined value d. The conducting zones and the zones blocking the current can assume different forms.

Figure 2:
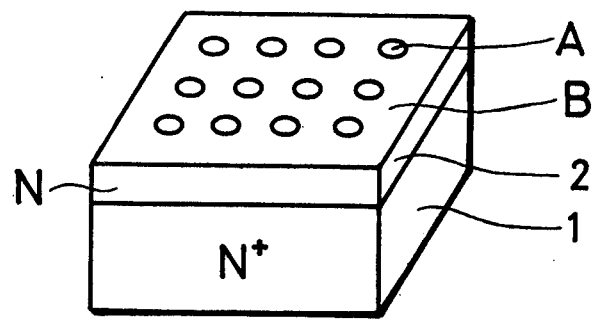
FIGS. 2 and 3 are respectively diagrammatic views which represent two modified forms of a device according to the invention.
Figure 3:
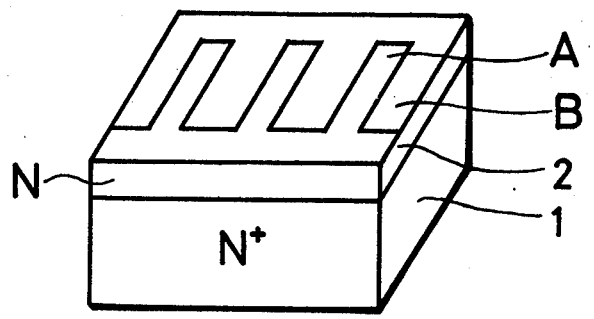

As shown in FIG. 2, there may be involved a mosaic comprising zones A and B, such that the injected current follows a quasi-filiform path, or as shown in FIG. 3, zones A and B comprising interdigital conducting and blocking branches. The path followed by the current in this case is lamellar.

The structures in accordance with the invention can be obtained by using the known techniques of masking, localised epitaxy, diffusion, evaporation under vacuum, electroforming, etc.

One process for producing a device according to the invention is given below simply by way of example.

On a very strongly doped semiconductor substrate of GaAs of type $N^+$, for example, a layer of like material but of type N forms the active part of the device, it is in this latter layer that the Gunn effect is developed. On the surface of the element opposite to the anode, a layer of type P is then created over the entire surface of the said element, by any of the known means such as epitaxy, diffusion of ionic implantation. Through an appropriate mask which reproduces the configuration of the motifs A and B of the previously defined mosaic, an etching permits this layer of P type to be hollowed out locally and to expose the active layer at the level where the zones A have to be formed. The layer of type P, which remains, forms the zones B. A metallic deposit (for example germanium-gold alloy) is then formed upon the entire surface of the element as thus treated. This deposit fills the previously bared regions and covers the layer of type P (zones B), thus serving a double purpose: that of a contact, injecting the current at the level of the zones A and, that of a cathode control electrode, serving to conduct the current and to assure the state of equipotentiality between the two zones A and B. The current under these conditions is blocked at the level of the zones B by the PN junction and is injected at the level of the metallic zones A and then follows the path which is either filiform or lamellar, as previously defined.

A PN junction such as previously described is not the only element capable of blocking the injection of the current. In fact, any element capable of forming a potential barrier can achieve this function. In particular, it may be a Schottky barrier. In this case, a first metallic deposit (for example, of a Germanium-gold alloy) is deposited over the entire surface of the active layer opposite to the anode. Through a suitable mask reproducing the configuration of the motifs A and B of the previously defined mosaic, this first metallic deposit is attacked and hollowed out locally, at the level of the zones B until, at this level, the active layer is exposed. The zones where this first metallic deposit still remains correspond to the zones A. A second metallic deposit capable of forming a Schottky barrier with the subjacent semiconductor material is deposited over the entire surface of the element thus treated. This can be a deposit of platinum, nickel, etc... This second deposit has two purposes, that of a contact blocking the injection of current at the level of the zones B and that of a cathode control electrode designed to conduct the current, which is then injected through the metallic zones A.

The zones A can themselves be formed in different ways. In the example as described, these are metallic deposits and thus ohmic contacts. Layers of very strongly doped semiconductor material (for example of $N^+$ type) can also fulfil this function, as well as any combination leading to an ohmic contact or to a non-ohmic contact, that is to say, capable of injecting a limited current.

Figure 4:
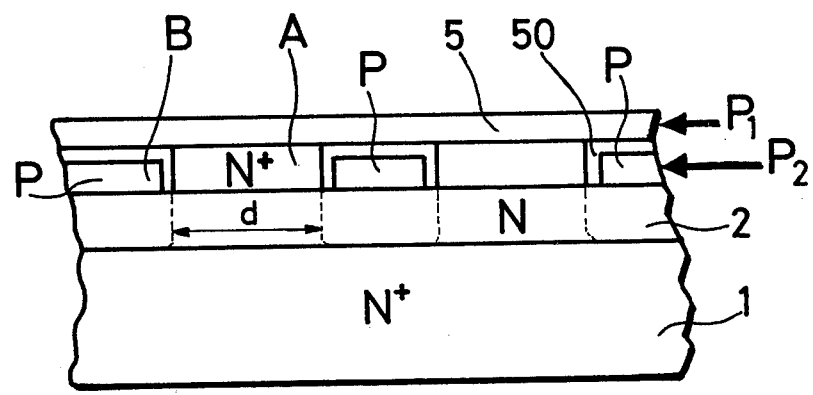
FIG. 4 represents an improvement applied to the devices which are shown in the preceding figures.

FIG. 4 represents diagrammatically an improvement in the devices according to the invention as previously described, which improvement permits a better control of the current injected into the device. A dielectric layer 50 insulating the zones A from the zones B permits this result to be obtained. The embodiment shown diagrammatically in FIG. 4 relates to a device of the type such as that described in FIG. 1.

Different formation processes can be used for establishing such a structure. One of these consists, for example, in depositing on the surface of the active part of the device, after the formation of the zones B of P type, a dielectric layer 50 which is engraved to the level where the zones A have to be formed. These latter can be formed by a very strongly doped semiconductor layer (GaAs) of $N^+$ type, obtained by epitaxy. The metallic control electrode 5 deposited by vacuum evaporation covers the whole of the dielectric layer and the zones A.

Under these conditions, the zones A are well insulated electrically from the zones B. A first supply of negative biasing $P_1$ can then be connected to the cathode control electrode 5 and a second bias supply $P_2$, also negative, can be connected to all the zones B of type P. It is then possible, by the zones B being biased to a greater or lesser extent negatively relatively to the zones A, to control electronically the injected current which, according to the invention, follows a channel between the parts of the device made dielectric, the transverse dimension d of said channel being controlled.

We claim:

1. Gunn effect hyperfrequency device comprising an active layer formed of a semiconductor material deposited on a strongly doped substrate of the same type of conductivity, a first anode contact formed by said substrate, and a second cathode contact, wherein said cathode contact comprises a mosaic of conducting zones A adjoining zones B capable of blocking the injection of the current, the respective dimensions of the said zones being such that zones of space charges capable of reaching said substrate are developed and define a plurality of channels, each having a controlled transverse dimension d, the product n.d, being lower than $10.^{11}$ cm$^{-2}$, n being the doping concentration in said active layer.

2. Device according to claim 1, wherein said semiconductor consists of GaAs.

3. Device according to claim 1, further comprising a metallic control electrode deposited on the said mosaic and assuring the conduction of the current.

4. Device according to claim 1, wherein said zones A are formed by a first metallic deposit, said zones B by a second metallic deposit brought into contact with the said active layer and forming with the latter a Schottky barrier.

5. Device according to claim 3, wherein said active layer is of N type, the said zones B are of P type and the said zones A are metallic.

6. Semiconductor device according to claim 1, wherein said active layer is of N type, said zones B are of P type and said zones A are of strongly doped $N^+$ type.

7. Semiconductor device according to claim 1, wherein a layer of dielectric material insulates the said zones A from the said zones B.

8. Semiconductor device according to claim 7, wherein said zones A comprise biasing connection to a first potential d.c supply, the said zones B having connection to a second d.c supply.

* * * * *